United States Patent
Grosh et al.

(10) Patent No.: US 11,259,124 B2
(45) Date of Patent: Feb. 22, 2022

(54) ACOUSTIC TRANSDUCER WITH GAP-CONTROLLING GEOMETRY AND METHOD OF MANUFACTURING AN ACOUSTIC TRANSDUCER

(71) Applicant: Vesper Technologies Inc., Boston, MA (US)

(72) Inventors: Karl Grosh, Boston, MA (US); Robert J. Littrell, Boston, MA (US)

(73) Assignee: Vesper Technologies Inc., Boston, MA (US)

( * ) Notice: Subject to any disclaimer, the term of this patent is extended or adjusted under 35 U.S.C. 154(b) by 518 days.

(21) Appl. No.: 16/353,934

(22) Filed: Mar. 14, 2019

(65) Prior Publication Data
US 2019/0281393 A1    Sep. 12, 2019

Related U.S. Application Data

(63) Continuation of application No. 14/702,319, filed on May 1, 2015, now Pat. No. 10,284,960, which is a
(Continued)

(51) Int. Cl.
*H04R 17/02* (2006.01)
*H04R 31/00* (2006.01)
(Continued)

(52) U.S. Cl.
CPC ............ *H04R 17/02* (2013.01); *H01L 41/27* (2013.01); *H01L 41/314* (2013.01);
(Continued)

(58) Field of Classification Search
CPC ..... H01L 41/27; H01L 41/314; H01L 41/332; H04R 7/06; H04R 17/02; H04R 17/025;
(Continued)

(56) References Cited

U.S. PATENT DOCUMENTS

| | | | |
|---|---|---|---|
| 4,456,394 A | 6/1984 | Kolm et al. | |
| 5,633,552 A | 5/1997 | Lee et al. | |

(Continued)

FOREIGN PATENT DOCUMENTS

| | | |
|---|---|---|
| CN | 101929898 | 12/2010 |
| JP | 2011004129 | 1/2011 |
| KR | 10-1053257 | 8/2011 |

OTHER PUBLICATIONS

KR Grant of Patent in Korean Appln. No. 20207008813, dated Sep. 21, 2020, 2 pages (with English translation).
(Continued)

*Primary Examiner* — Shawki S Ismail
*Assistant Examiner* — Monica Mata
(74) *Attorney, Agent, or Firm* — Fish & Richardson P.C.

(57) ABSTRACT

A transducer of the preferred embodiment including a transducer and a plurality of adjacent, tapered cantilevered beams. Each of the beams define a beam base, a beam tip, and a beam body disposed between the beam base and the beam tip. The beams are arranged such that each of the beam tips extends toward a common area. Each beam is joined to the substrate along the beam base and is free from the substrate along the beam body. A preferred method of manufacturing a transducer can include: depositing alternating layers of piezoelectric and electrode onto the substrate in block, processing the deposited layers to define cantilever geometry in block, depositing metal traces in block, and releasing the cantilevered beams from the substrate in block.

12 Claims, 4 Drawing Sheets

Related U.S. Application Data continuation of application No. 13/398,631, filed on Feb. 16, 2012, now Pat. No. 9,055,372.

(60) Provisional application No. 61/470,384, filed on Mar. 31, 2011.

(51) Int. Cl.
    *H04R 7/06* (2006.01)
    *H01L 41/27* (2013.01)
    *H01L 41/314* (2013.01)
    *H01L 41/332* (2013.01)

(52) U.S. Cl.
    CPC ............. *H01L 41/332* (2013.01); *H04R 7/06* (2013.01); *H04R 31/003* (2013.01); *H04R 17/025* (2013.01); *H04R 31/00* (2013.01); *H04R 2201/003* (2013.01); *H04R 2410/03* (2013.01)

(58) Field of Classification Search
    CPC ............................ H04R 31/00; H04R 31/003; H04R 2201/003; H04R 2410/03
    See application file for complete search history.

(56) References Cited

U.S. PATENT DOCUMENTS

| | | |
|---|---|---|
| 5,956,292 A | 9/1999 | Bernstein |
| 6,201,341 B1 | 3/2001 | Fujimoto |
| 6,857,501 B1 | 2/2005 | Han et al. |
| 6,944,922 B2 | 9/2005 | Shearer et al. |
| 7,992,431 B2 | 8/2011 | Shih et al. |
| 9,055,372 B2 | 6/2015 | Grosh et al. |
| 10,284,960 B2 | 5/2019 | Grosh et al. |
| 2004/0061415 A1 | 4/2004 | Shearer et al. |
| 2004/0075363 A1 | 4/2004 | Malkin et al. |
| 2004/0164649 A1 | 8/2004 | Xu et al. |
| 2006/0087203 A1 | 4/2006 | Cho |
| 2007/0145861 A1 | 6/2007 | Tanner |
| 2010/0084721 A1 | 4/2010 | Wu et al. |
| 2010/0189289 A1 | 7/2010 | Takeuchi |
| 2010/0254547 A1 | 10/2010 | Grosh et al. |
| 2010/0290142 A1 | 11/2010 | Krastev et al. |
| 2011/0075879 A1 | 3/2011 | Kim et al. |
| 2012/0053393 A1 | 3/2012 | Kaltenbacher et al. |
| 2012/0250909 A1 | 10/2012 | Grosh et al. |
| 2012/0270352 A1 | 10/2012 | Huffman et al. |
| 2015/0271606 A1 | 9/2015 | Grosh et al. |

OTHER PUBLICATIONS

Office Action in corresponding Japanese Application No. 2014-502569, dated Jul. 1, 2014, pp. 1-3.

Office Action in corresponding U.S. Appl. No. 13/398,631 dated Oct. 22, 2014, pp. 1-13.

Response to Office Action dated Oct. 22, 2014, in corresponding U.S. Appl. No. 13/398,631 dated Jan. 21, 2015, pp. 1-12.

ACOUSTIC TRANSDUCER WITH GAP-CONTROLLING GEOMETRY AND METHOD OF MANUFACTURING AN ACOUSTIC TRANSDUCER

CROSS-REFERENCE TO RELATED APPLICATIONS

This application is a continuation and claims priority to U.S. application Ser. No. 14/702,319, filed May 1, 2015, which is a continuation and claims priority to U.S. application Ser. No. 13/398,631, filed Feb. 16, 2012, which claims priority to provisional application No. 61/470,384 entitled "Acoustic Sensor with Gap-Controlling Geometry and Method of Manufacturing an Acoustic Sensor" and filed 31 Mar. 2011, the entire contents of each of which are incorporated herein by this reference.

BACKGROUND

The current trend in acoustic transducer technology has been toward smaller microphones. Currently, electret microphones based on thin, charge-carrying membranes have been used in most applications. However, these microphones suffer from degradation after exposure to high temperatures. Capacitive MEMS microphones are gaining popularity because they can withstand the high temperatures experienced during solder-reflow and, therefore, reduce manufacturing cost. Piezoelectric MEMS microphones have been researched for more than 30 years and can potentially combine the advantages of electret microphones and MEMS capacitive microphones in a cost-effective manner. Unfortunately, piezoelectric MEMS microphones traditionally suffer from high noise floors due, in part, to diaphragm tension caused by residual stress in thin films. For example, diaphragm microphones are constrained on all edges, which leads to high diaphragm tension that results in decreased sensitivity. Conventional cantilevered designs, such as rectangular cantilever beam microphones, also suffer from the effects of residual stress despite being substantially released from the surrounding substrate; instead, the small amount of residual stress causes the cantilever to bend away from the substrate plane, either upwards or downwards. This bending causes the gap around the cantilever to increase, decreasing the acoustic resistance and resulting in an undesirable decrease in low-frequency sensitivity.

Thus, there is a need in the piezoelectric MEMS acoustic transducer field to create a new and useful acoustic transducer with low frequency sensitivity despite residual stresses.

DESCRIPTION OF THE PREFERRED EMBODIMENTS

The following description of the preferred embodiments of the invention is not intended to limit the invention to these preferred embodiments, but rather to enable any person skilled in the art of MEMS acoustic transducers to make and use this invention.

Acoustic Transducer

Figure 1:
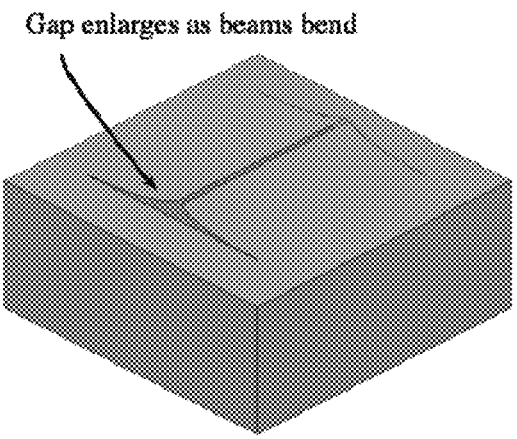
FIG. 1 is a schematic representation of a representative prior art transducer.
Figure 2:
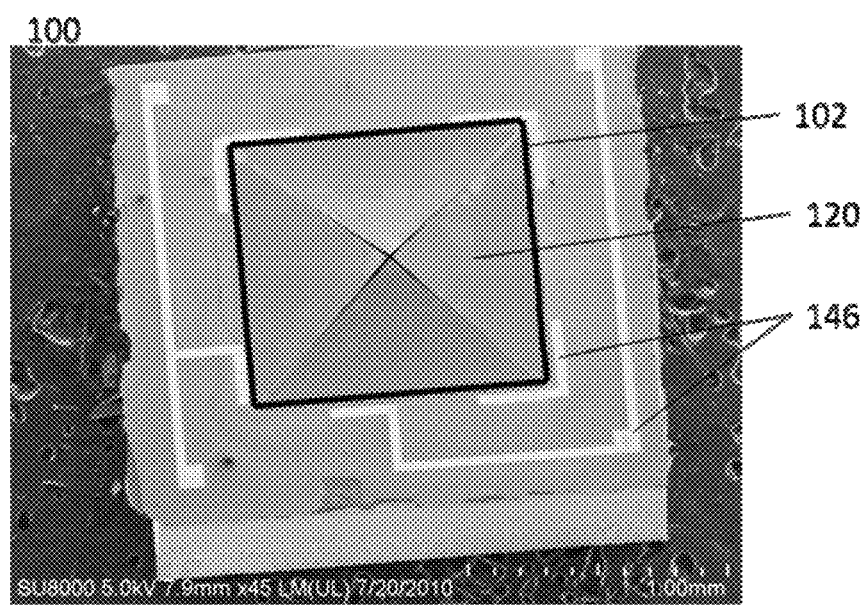
FIG. 2 is a plan microscopic view of a cantilevered beam in accordance with a preferred embodiment of the present invention.
Figure 3A:
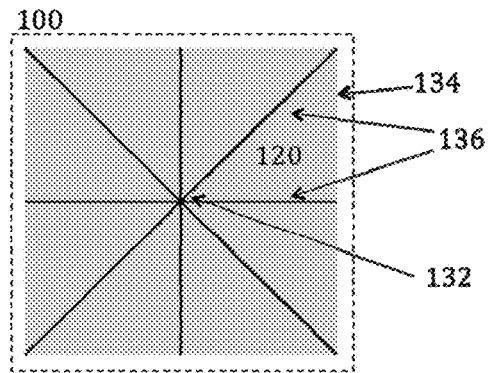
FIGS. 3A, 3B, 3C, 3D, and 3E are schematic representations of a first, second, third, fourth, and fifth preferred embodiments of the present invention, respectively.
Figure 3B:
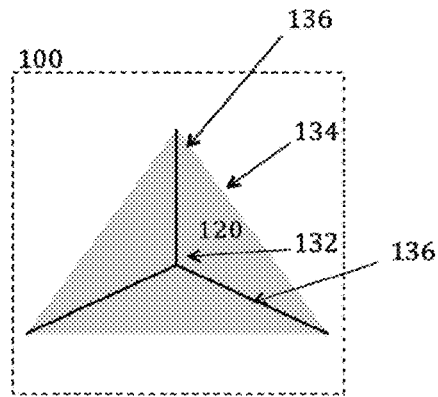
Figure 3C:
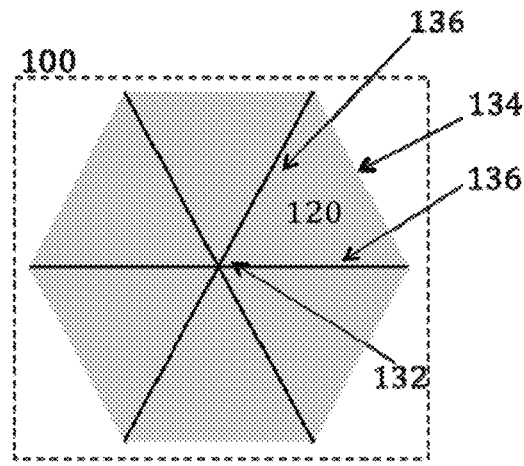
Figure 3D:
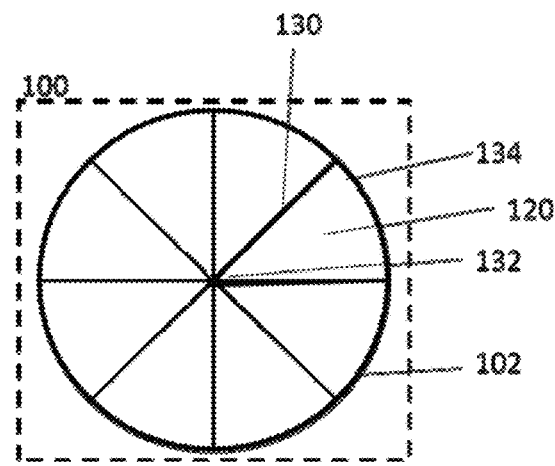
Figure 3E:
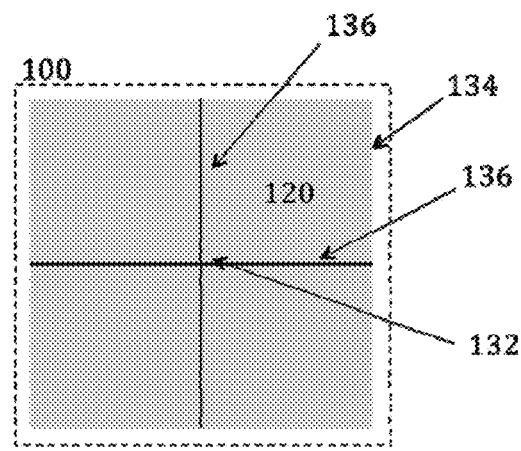
Figure 4:
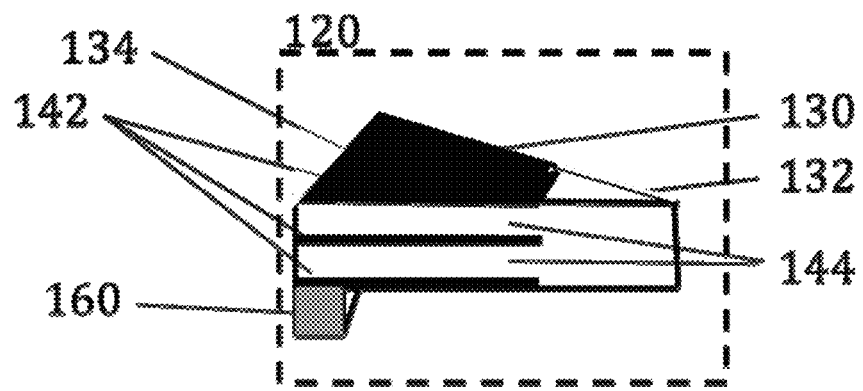
FIG. 4 is a schematic perspective view of a portion of a transducer in accordance with the preferred embodiments of the present invention.

As shown in FIGS. 2, 3, and 4, a transducer 100 of the preferred embodiment can include a substrate 160 and multiple cantilevered beams 120 arranged in a gap-controlling arrangement, each beam 120 including gap-controlling geometry 130. The geometry and arrangement of the preferred transducer 100 allows the gap resistance to be controlled, which in turn enables control of the frequency below which the response of the microphone "rolls off" or diminishes. The transducer 100 is preferably a piezoelectric transducer, but may alternatively be a capacitive transducer, an optical transducer (e.g. optical acoustic sensor), or any other suitable transducer that suffers from stressed cantilevers. The preferred transducer 100 is preferably an acoustic transducer, more preferably an acoustic sensor (i.e. microphone), but may alternatively be driven with a voltage or current and used as a speaker. The preferred transducer 100 is preferably incorporated into consumer electronics, such as mobile phones, but may be used in medical applications (e.g. hearing aids), photoacoustic detection, ultrasonic applications, or any other transducer-based application as a sensor or speaker. The cantilever arrangement of the preferred transducer 100 functions to limit the gap size to the separation distance between adjacent cantilevered beams 120. This is in contrast with conventional designs, wherein the residual stress within the cantilevered beams cause the beams to deflect drastically after separation, sometimes as much as the distance between the substrate and the cantilevered beams. In the transducer 100 of the preferred embodiments, the proximity between the multiple cantilevered beams 120 on the substrate 160 causes the residual stresses between the beams 120 to be similar. The similar stress profiles between the adjacent cantilever beams result in similar cantilever curvatures, which, in turn, limits the gap size to the separation distance between adjacent cantilevered beams 120.

As shown in FIG. 4, the preferred transducer 100 can include a substrate 160. The substrate 160 of the preferred transducer 100 functions to support the transducer 100 during the manufacturing process, as well as to support the cantilevered beam 120 of the transducer 100 during operation. In one variation of the preferred transducer 100, the substrate 160 is composed at least in part of silicon or any suitable silicon-based compound or derivative (e.g. Si wafer, SOI, polySi on SiO2/Si, etc.) Alternately, the substrate 160 can be composed at least in part of fiberglass, glass, or any suitable combination of materials. In another variation of the preferred transducer 100, the substrate 160 is substantially removed from the active area of the cantilevered beams 120 during the manufacturing process such that the cantilevered beams 120 have maximized travel and response.

As shown in FIGS. 2, 3, and 4, the preferred transducer 100 can include at least one cantilevered beam 120. More preferably, the preferred transducer 100 can include a plurality or array of cantilevered beams 120 arranged in a suitable geometry, such as those shown for example in FIGS. 3A to 3E. The cantilevered beams 120 of the preferred transducer 100 function to transform acoustic pressure into electronic signals. The cantilevered beams 120 preferably include gap-controlling geometry 130 that minimizes the resultant gaps between each of the cantilevered beams 120 with a larger plurality or array. The gap-controlling geometry 130 of the cantilevered beam 120 preferably includes a tip 132 and a base 134. In a preferred cantilevered beam 120, the tip 132 is substantially smaller than the base 134, such that the cantilevered beam 120 tapers from the base 134 to the tip 132. Except for the base 134, which is preferably substantially coupled to the substrate 160, the whole of the cantilevered beam 120 is preferably substantially detached from the surrounding substrate 160 such that it can expand or contract to relieve imparted stress.

As shown in FIGS. 3A-3E, the cantilevered beam 120 preferably has a substantially pointed gap-controlling geometry 130, such that the base 134 is substantially wider than the tip 132 along a direction perpendicular to a direction of travel of the cantilevered beam 120. For example, one variation of the preferred transducer 100, the cantilevered beam 120 shown in FIGS. 3A, 3B, and 3C can have a substantially triangular geometry. In another variation of the preferred transducer 100, the cantilevered beam 120 can have a circular sector- or wedge-like geometry 130 with a substantially curved base 134 as shown in FIG. 3D. In another variation of the preferred transducer 100, the cantilevered beam 120 can have a square geometry as shown in FIG. 3E. In other variations of the transducer 100 of the preferred embodiment, the cantilevered beam 120 can have any suitable geometry in which the tip 132 is narrower in breadth than the base 134 along a direction perpendicular to the direction of travel of the cantilevered beam 120. Suitable alternative geometries can include any type of polygonal shape or circular sector, and each cantilevered beam 120 with an array can have substantially identical or substantially non-identical geometries. The length of the cantilevered beam 120 is preferably adjusted to match the desired resonant frequency of the microphone, but may alternatively be longer or shorter. The base 134 is preferably twice as wide as the length, but may alternatively have any width that allows for the desired transducer 100 outer perimeter 102 geometry to be achieved.

The cantilevered beam 120 is preferably made from alternating piezoelectric and electrode layers 142. The piezoelectric layers 144 can function to convert applied pressures to voltages, and the electrode layers 142 can function to transmit the generated voltages to an amplifier such as a JFET, a charge amplifier, or an integrated circuit. The piezoelectric layers 144 preferably include aluminum nitride (AlN) due to its CMOS compatibility, but may alternatively include lead zirconate titanate (PZT), zinc oxide (ZnO), polyvinylidene fluoride (PVDF), lead mangnesium niobate-lead titanate (PMN-PT), or any other suitable piezoelectric material. The electrode layers 142 preferably include molybdenum (Mo), titanium (Ti), aluminum (Al), or platinum (Pt), but may alternately include any other suitable electrode material. The cantilevered beam 120 preferably includes two piezoelectric layers 144 interspersed between three electrode layers 142. However, the cantilevered beam 120 can include three piezoelectric layers 144 interspersed between the three electrode layers 142, include only three total layers (a first electrode layer 142, a first piezoelectric layer 144, and a top electrode layer 142), or any number of layers in any suitable permutation of electrode layers 142 and piezoelectric layers 144. Preferably, the cantilevered beam 120 incorporates at least one piezoelectric layer 144 and one electrode layer 142. In one example configuration, the electrode layers 142 preferably cover substantially two-thirds of a substantially triangular cantilevered beam 120 area to minimize the noise floor, but can alternately cover more or less of the cantilevered beam 120 depending on the cantilevered beam 120 geometry. Additionally, although each electrode layer 142 preferably defines only one independent electrode per electrode layer 142, the electrode layers 142 may be patterned to define multiple independent electrodes per electrode layer 142. The electrode layers 142 are preferably coupled together by metal traces in series, but may be coupled in parallel or both in series and in parallel.

As shown in FIG. 3, the preferred transducer 100 is configured such that substantially identical cantilevered beams 120 are arranged such that the tips 132 meet in a common area substantially near the center of the acoustic transducer 100. Preferably, each of the free edges 136 of each cantilevered beam 120 are preferably each parallel to a free edge 136 of the adjacent cantilevered beam 120. The respective bases 134 of the cantilevered beams 120 preferably form an outer perimeter 102 in the shape of a regular polygon and/or circle. The outer perimeter 102 of the transducer 100 is preferably a square wherein the transducer 100 preferably incorporates four cantilevered beams 120 (shown in FIG. 3A), but the outer perimeter 102 may alternately be a circle wherein the acoustic transducer incorporates any suitable number of wedge-like cantilevered beams 120 (shown in FIG. 3D), a triangle wherein the transducer 100 preferably incorporates three cantilevered beams 120 (shown in FIG. 3B), an octagon wherein the transducer 100 preferably incorporates eight cantilevered beams 120, a hexagon wherein the transducer 100 preferably incorporates six cantilevered beams 120 (shown in FIG. 3C), or any geometric shape incorporating any requisite number of cantilevered beams 120.

In the preferred transducer, the gaps between the cantilevered beams 120 are approximately less than 1 micron during manufacture, but may be slightly larger. After manufacture, the gaps between the cantilevered beams 120 are preferably maintained under 1 micron, but may be significantly larger due to deformation resulting from residual stress. The cantilevered beams 120 are preferably electrically coupled through one or more electrode layers 142, but may alternately be electrically coupled by conductive traces 146, be electrically isolated from one another, or be a blend, wherein some cantilevered beams 120 are electrically coupled while others are electrically isolated. The cantilevered beams 120 may be coupled in series or in parallel, but are preferably coupled with a blend of the two extremes, wherein some cantilevered beams 120 are coupled in series and others in parallel.

Method of Manufacturing an Acoustic Transducer

Figure 5:
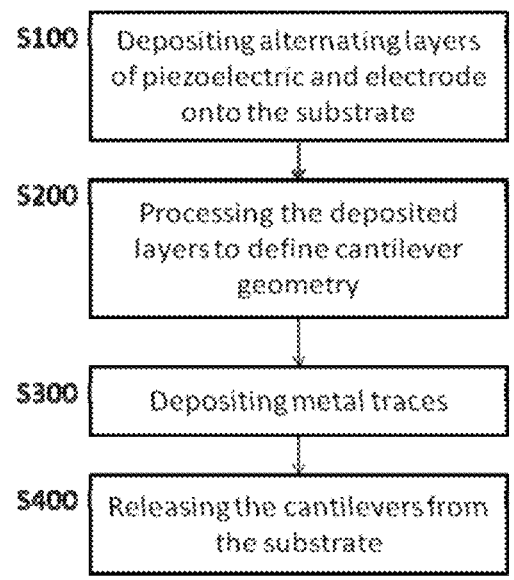
FIG. 5 is a flowchart depicting a method of manufacturing a transducer in accordance with a preferred embodiment of the present invention.

As shown in FIGS. 5 and 6, a preferred method of manufacturing a transducer can include: depositing alternating layers of piezoelectric and electrode onto the substrate in block S100, processing the deposited layers to define cantilever geometry in block S200, depositing metal traces in block S300, and releasing the cantilevered beams 120 from the substrate 100 in block S400. As the transducer 100 is preferably fabricated using standard CMOS processes, associated electronics (e.g. a JFET, charge amplifier, integrated circuit) may be fabricated on the same substrate as the transducer 100 using the same CMOS process.

Block S100 of the preferred method recites depositing alternating piezoelectric and electrode layers onto the substrate. Block S100 preferably functions to create the layers of the cantilever. The piezoelectric layers preferably include aluminum nitride (AlN) due to its CMOS compatibility, but may alternatively include lead zirconate titanate (PZT), zinc oxide (ZnO), polyvinylidene fluoride (PVDF), lead magnesium niobate-lead titanate (PMN-PT), or any other suitable piezoelectric material. The electrode layers preferably include molybdenum (Mo), titanium (Ti), aluminum (Al) or platinum (Pt), but may alternately include any other suitable electrode material. The cantilever is preferably manufactured using surface micromachining, but may alternatively be manufactured by bulk micromachining. Each layer is preferably deposited onto the previous layer (wherein the first layer is deposited onto a SiO2 layer), then etched into a desired pattern before the next layer is deposited. Each layer is preferably deposited by thin film deposition, but may alternately be deposited by reactive physical vapor deposition, physical vapor deposition, chemical vapor deposition, epitaxy, or any suitable process. Each layer is preferably first patterned by photolithography, then micromachined to remove the material in the areas exposed by photolithography. Micromachining methods may include wet etching (chemical etching) and dry etching (e.g. through reactive ion etching or ion milling), but may include any other suitable etching method. In one embodiment, the electrode layers are patterned such that alternating layers are staggered (as shown in FIG. 6), such that every other electrode layer can be coupled in parallel by the metal traces deposited in S300. However, the electrode and piezoelectric layers can be patterned with any suitable pattern.

Block S200 of the preferred method recites processing the deposited layers to define cantilever geometry. Block S200 preferably functions to create gaps that define the gap-controlling geometry of the cantilever. The deposited layers are preferably processed by etching gaps through the deposited layers (e.g. with reactive ion etching, wet etching, ion milling, or any other etching method), but may alternatively be otherwise processed to define the cantilevered beams 120 and release them from their neighbors. The gap thicknesses are preferably 1 micron or less, but may alternately be slightly larger. Additionally, the gaps preferably bisect each other to form substantially triangular cantilevered beams, but may alternately intersect at the ends to form the desired gap-controlling geometry. This step preferably creates at least two bisecting gaps, such that at least four triangular cantilevered beams are formed, but may alternately create three, four, or any number of gaps to form any number of cantilevered beams.

Block S300 of the preferred method recites depositing metal traces. Block S300 preferably functions to electrically couple the acoustic transducer to one or more amplifiers. Block S300 can occur before, after, or concurrently with block S200. The metal traces are preferably deposited as a layer then patterned, but may alternately be pre-patterned and deposited onto the acoustic transducer. Block S300 preferably provides a metal trace for each electrode or electrode layer 142, but may provide a single metal trace for a plurality of electrodes, wherein the electrodes are coupled together in parallel. The metal traces preferably extend through the intermediary piezoelectric and/or electrode layers to the relevant electrode layer 142, but may be alternatively coupled to the transducer electrodes in any suitable manner.

Block S400 of the preferred method recites releasing the cantilevered beams from the substrate. Block S400 preferably functions to allow the cantilevered beams to expand, contract or bend as necessary to substantially relieve residual stress. The cantilevered beams are preferably released from the substrate by removing the substrate from underneath the cantilevered beams. This is preferably accomplished using DRIE (deep reactive ion etching), but may be accomplished using wet etching, EDM (electric discharge machining), micromachining processes, or any other processing method that releases the cantilevered beams from the substrate. Alternatively, the cantilevered beams can be entirely released from the substrate and subsequently reattached, either to the same substrate or to a different substrate. The cantilevered beams can be entirely released by providing a sacrificial layer between the substrate and the cantilevered beam layers before beam layer deposition (i.e. before block S100), and subsequently etching away the sacrificial layer in block S500. The sacrificial layer is preferably an oxide, but may be any suitable material dissimilar from the piezoelectric and electrode layer materials that may be selectively removed. The sacrificial layer is preferably etched away with an etchant, such as hydrogen fluoride (HF) in an aqueous solution, plasma etching, or any other suitable etching process. The cantilevered beams are preferably reattached to a substrate along their bases by electrostatic clamping or any suitable technique.

The preferred method can additionally include the step of growing an oxide layer on the substrate in block S500. Block S500 preferably occurs prior to block S100, and preferably functions to control the amount of cantilever beam release in S400. In one variation of block S400, the substrate removal process preferably ends at the oxide layer. In a second variation of block S500, the oxide layer preferably functions as the sacrificial layer. A suitable oxide is preferably grown over the desired active area of the transducer, but may alternatively be grown in the desired release areas of the transducer, over the entire substrate or in any suitable area. The oxide is preferably an oxide grown from the substrate, more preferably silicon dioxide (SiO2), but may be any suitable oxide that is grown or deposited on the substrate. The oxides are preferably grown using general thermal oxidization, but may alternatively be grown using plasma-enhanced chemical vapor deposition (PECVD oxide deposition), chemical vapor deposition (CVD oxide deposition), physical vapor deposition (PVD oxide deposition), or any other suitable oxidization or oxide deposition process. The preferred method can additionally include removing the oxide layer in block S500A, which removes the oxide layer from the transducer by etching or micromachining.

The preferred method can additionally include depositing a seed layer in block S600. The seed layer preferably functions as an active layer on which to build the cantilevered beams. Block S600 preferably occurs before block S100. More preferably, block S600 is performed after block S500 such that the seed layer is arranged between the piezoelectric or electrode layer of the cantilevered beam and oxide layer. The seed layer is preferably aluminum nitride (AlN), but may be any suitable piezoelectric, electrode, or seed material. The seed layer is preferably sputtered using physical vapor deposition (PVD) or any other suitable sputtering technique, but may be otherwise deposited over the oxide layer or substrate.

Example Method and Transducer

Figure 6A:
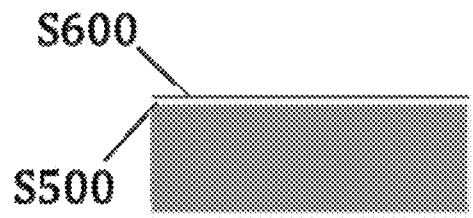
FIGS. 6A-6H are schematic representations of an example transducer manufactured in accordance with one variation of the method of the preferred embodiment.
Figure 6B:
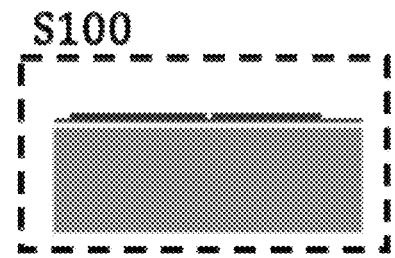
Figure 6C:
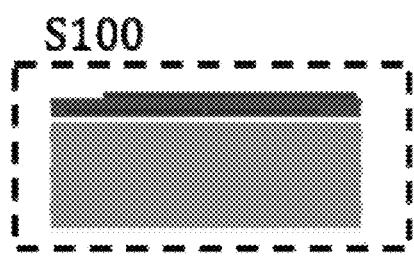
Figure 6D:
Figure 6E:
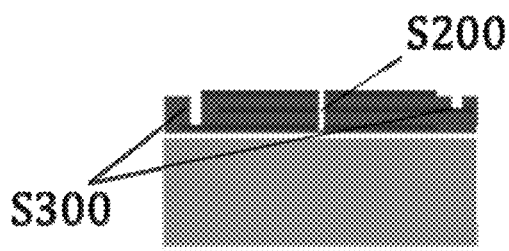
Figure 6F:
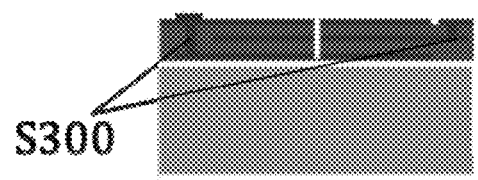
Figure 6G:
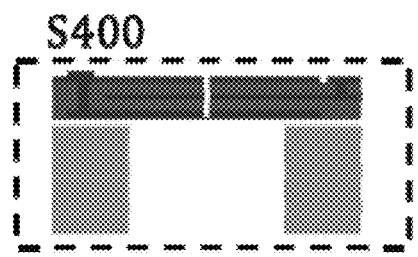
Figure 6H:
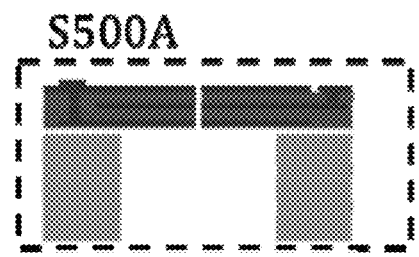

As shown in FIGS. 6A-6H, one example implementation of the preferred method includes growing a thermal oxide (SiO2) on the substrate in block S500, depositing an aluminum nitride (AlN) seed layer in block S600 (FIG. 6A), depositing and patterning a first electrode layer (molybdenum) (FIG. 6B), depositing and patterning a first piezoelectric layer (AlN) (FIG. 6C), depositing and patterning a second electrode layer (mobidum) (FIG. 6C), depositing and patterning a second piezoelectric layer (AlN) (FIG. 6D), and depositing and patterning a top electrode layer (molybdenum) (FIG. 6D) in block S100. Cavities can preferably be etched through the piezoelectric layers (AlN vias) to the electrode layers, and the metal traces deposited in block S300 (FIGS. 6E and 6F). In one variation, two metal traces are deposited, wherein the first cavity/metal trace extends to and couples with the top and bottom electrode, and the second cavity/metal trace extends to and couples with the middle electrode. The cantilever beams are defined from the deposited layers S200 (etched or micromachined) (FIG. 6E), and freed from the substrate by etching the substrate from the backside with deep reactive-ion etching (DRIE) in block S400 (FIG. 6G). The DRIE stops on the oxide layer, and the oxide layer is removed to release the transducer from the substrate S500A (FIG. 6H).

Throughout performance of the example method, the residual stress is preferably monitored using wafer curvature measurements (e.g. through optical or physical measurements), but may alternately be measured by stress measurements (e.g. stress transducers), nonlinear elastic stress measurements (e.g. ultrasonic or magnetic techniques, X-ray or neutron diffraction), or any other method of measuring the residual stress or curvature in the cantilever. The deposition parameters are then preferably adjusted to minimize the cantilever deflection or stress.

As a person skilled in the art will recognize from the previous detailed description and from the figures and claims, modifications and changes can be made to the preferred embodiments of the invention without departing from the scope of this invention defined in the following claims.

We claim:

1. A transducer comprising:
   a substrate having a central void region in the substrate;
   a plurality of cantilevered beams, each comprising a tapered beam body that extends from a beam base portion to a beam tip portion over the central void region, and with beam base portions supported over portions of the substrate, and with beam tip portions extending towards a common area, and with at least a portion of each of some of the cantilevered beams comprising:
   at least one layer of a piezoelectric material;
   a first electrode layer supported on a top surface of the at least one layer; and
   a second electrode layer supported on a bottom surface of the at least one layer.

2. The transducer of claim 1 wherein each tapered cantilevered beam is joined to the substrate along the beam base.

3. The transducer of claim 1 wherein each tapered cantilevered beam is joined to the substrate adjacent to the central void in the substrate and along the beam base through a portion of the at least one piezoelectric layer.

4. The transducer of claim 1 wherein each tapered cantilevered beam is joined to the substrate adjacent to the central void in the substrate and along the beam base, through a portion of the second electrode layer that is on the bottom surface of the at least one piezoelectric layer.

5. The transducer of claim 1 wherein each of the tapered cantilevered beams being free from the substrate along the beam body and beam tip.

6. The transducer of claim 1 wherein the one or more piezoelectric layers are comprised of one or more of aluminum nitride (AlN) lead zirconate titanate (PZT), zinc oxide (ZnO), polyvinylidene fluoride (PVDF), lead mangnesium niobate-lead titanate (PMN-PT).

7. The transducer of claim 1 wherein the electrode layers are comprised of one or more of molybdenum (Mo), titanium (Ti), aluminum (Al), platinum (Pt).

8. The transducer of claim 1 wherein the substrate is comprised of a silicon or silicon-based compound or derivative or fiberglass, glass, or any suitable combination of materials.

9. The transducer of claim 1 wherein the first layer of the cantilever beam is on a SiO2 layer.

10. The transducer of claim 1 wherein adjacent transducer beams are spaced by substantially uniform gaps having a gap width approximately 1 micron or less.

11. The transducer of claim 1 wherein the transducer is a microphone.

12. The transducer of claim 1 wherein the transducer is a microphone and the cantilevered beams have a triangular shape, with the beam bases providing a substantially polygonal perimeter about the central void.

* * * * *

UNITED STATES PATENT AND TRADEMARK OFFICE
CERTIFICATE OF CORRECTION

| | |
|---|---|
| PATENT NO. | : 11,259,124 B2 |
| APPLICATION NO. | : 16/353934 |
| DATED | : February 22, 2022 |
| INVENTOR(S) | : Grosh et al. |

It is certified that error appears in the above-identified patent and that said Letters Patent is hereby corrected as shown below:

In the Claims

Column 8, Line 23, Claim 6, delete "(AlN)" insert -- (AlN), --.

Column 8, Line 23, Claim 6, delete "mangnesium" insert -- magnesium --.

Signed and Sealed this
Sixteenth Day of August, 2022

Katherine Kelly Vidal
*Director of the United States Patent and Trademark Office*